(12) United States Patent
Lee

(10) Patent No.: US 6,440,784 B2
(45) Date of Patent: Aug. 27, 2002

(54) THIN FILM TRANSISTOR AND A FABRICATING METHOD THEREOF

(75) Inventor: Sang-Gul Lee, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/828,156

(22) Filed: Apr. 9, 2001

Related U.S. Application Data

(62) Division of application No. 09/364,687, filed on Jul. 30, 1999, now Pat. No. 6,232,158.

(30) Foreign Application Priority Data

Jul. 30, 1998 (KR) .............................. 98-30868

(51) Int. Cl.[7] .............................................. H01L 21/84
(52) U.S. Cl. ....................... 438/161; 438/162; 438/163; 438/164
(58) Field of Search ................................ 438/161, 153, 438/154, 162, 164, 166, 30, 163; 349/42, 41, 43, 47; 257/72, 71, 70, 59

(56) References Cited

U.S. PATENT DOCUMENTS

| | | | |
|---|---|---|---|
| 4,514,253 A | 4/1985 | Minezaki | 156/659.1 |
| 4,654,117 A | 3/1987 | Aoki et al. | 156/659.1 |
| 5,627,103 A | 5/1997 | Li | 438/158 |
| 5,686,326 A | 11/1997 | Kitahara et al. | 437/40 |
| 5,714,790 A | 2/1998 | Sakamoto | 257/440 |
| 5,733,804 A | 3/1998 | Hack et al. | 438/158 |
| 5,909,615 A * | 6/1999 | Kuo | 438/157 |
| 5,917,199 A * | 6/1999 | Byun et al. | 257/59 |
| 5,940,151 A * | 8/1999 | Ha | 257/72 |
| 6,166,785 A * | 12/2000 | Ha | 349/42 |
| 6,204,520 B1 * | 3/2001 | Ha et al. | 257/72 |
| 6,232,158 B1 * | 5/2001 | Lee | 438/160 |
| 6,275,275 B1 * | 8/2001 | Ha | 349/42 |
| 6,337,234 B2 * | 1/2002 | Ha et al. | 438/161 |

FOREIGN PATENT DOCUMENTS

KR 99013298 A * 7/1998

* cited by examiner

Primary Examiner—Keith Christianson
Assistant Examiner—Laura M Schillinger
(74) Attorney, Agent, or Firm—Long Aldridge & Norman LLP

(57) ABSTRACT

The present invention relates to a thin film transistor and a fabricating method thereof wherein a source/drain region and a gate electrode are formed in the same layer, which improves the degree of planarization. Because source/drain electrodes and a gate electrode are formed by patterning the same layer with a single mask, the invention reduces the number of fabrication steps. The TFT includes an insulated substrate which is transparent, a source electrode and a drain electrode on the insulated substrate. The source and drain electrodes are separated each other, and a gate electrode is between the source and drain electrodes on the insulated substrate. A gate insulating layer covers the source and drain electrodes and the gate electrodes on the gate insulating layer. An active layer is then formed on the gate insulating layer. Source and drain regions are formed at each end of the active layer corresponding to the gate electrode and a channel region is formed between the source and drain regions. A passivation layer is then formed on the gate insulating layer, wherein the passivation layer covers the active layer, first and second contact holes exposing the source and drain regions and the source and drain electrodes, respectively. A first wire formed on a predetermined part of the passivation layer electrically connects the source region to the source electrode through the first contact hole. A second wire formed on another predetermined part of the passivation layer electrically connects the drain region to the drain electrode through the second contact hole.

14 Claims, 7 Drawing Sheets

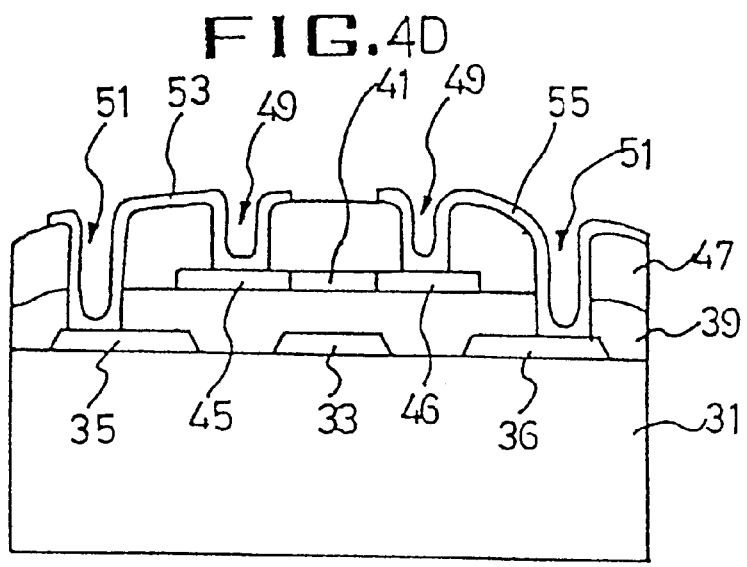
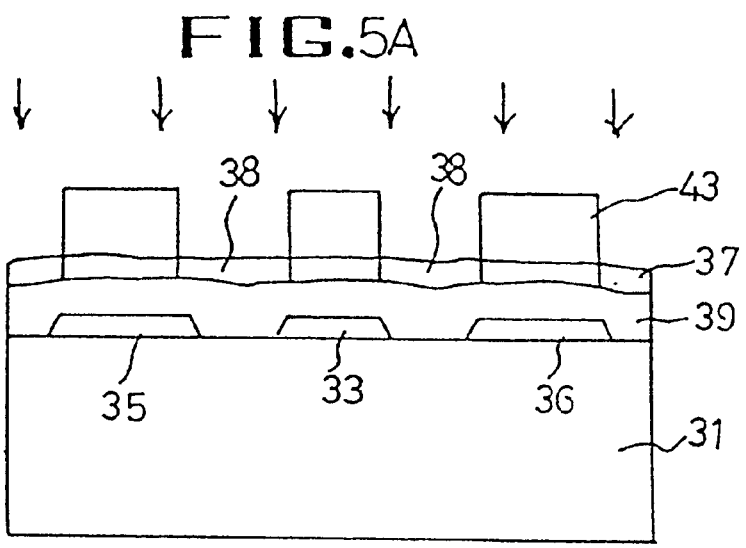
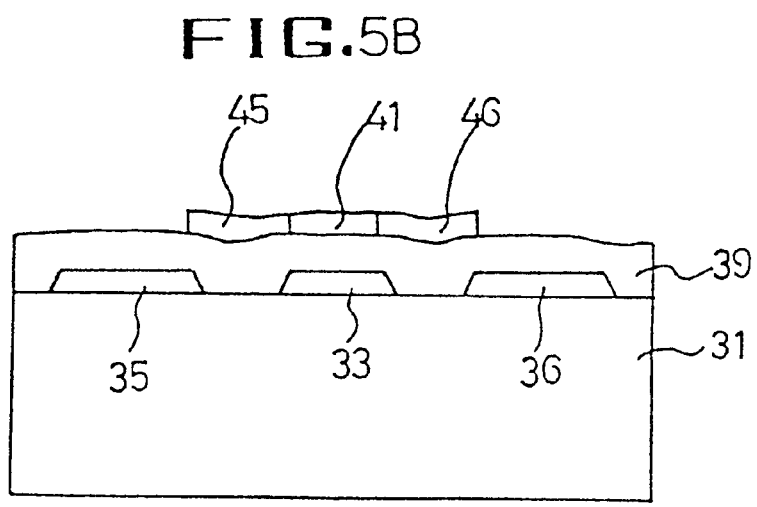

THIN FILM TRANSISTOR AND A FABRICATING METHOD THEREOF

This application is a division of application Ser. No. 09/364,687, filed Jul. 30, 1999, now U.S. Pat. No. 6,232,158.

BACKGROUND OF THE INVENTION

1. Field of the Invention

The present invention relates to a thin film transistor and a fabricating method thereof wherein a source/drain region and a gate electrode are formed from the same layer.

2. Discussion of Related Art

Compared to an amorphous silicon thin film transistor (hereinafter abbreviated TFT), a polycrystalline silicon TFT has a high mobility of electrons and holes and can be used as a CMOS TFT. Accordingly, a liquid crystal display (hereinafter abbreviated LCD) having polycrystalline silicon TFTs has a structure such that both a driver and a pixel array are formed on a glass substrate.

When polycrystalline silicon TFTs are used to form a driver, switching operations of the LCD at a fast frequency is possible because of the characteristics of polycrystalline silicon. However, when polycrystalline silicon TFTs are fabricated on a pixel array in an LCD, the characteristics of the image is deteriorated by the high drain current of the off-states due to the characteristics of polycrystalline silicon.

More recently, in order to reduce the off-current in a pixel array to a proper level, TFTs having a lightly doped drain (hereinafter abbreviated LDD) structure, an offset structure, or the like, have been used in the related art.

FIG. 1 shows a cross-sectional view of a TFT according to the related art. Referring to FIG. 1, a buffer oxidation layer 13 is formed on an insulated substrate 11, and an active layer 15 of polycrystalline silicon is formed on the buffer oxidation layer 13. In a predetermined portion of the active layer 15, a gate insulating layer 17 and a gate electrode 19 are formed, wherein the channel region is in the middle of the active layer 15 and the length of the gate electrode 19 is shorter than that of the gate insulating layer 17.

The sides of the active layer 15 extending beyond the gate electrode 19 are doped with n- or p- type impurities. The region of the active layer that also extends beyond gate insulating layer 17 becomes a source region 21 and a drain region 22, doped heavily with impurities. The region of the active layer that extends beyond the gate electrode, but not beyond the gate insulating electrode, becomes a lightly doped region 23 that forms an LDD. The portion of the active layer that lies between the LDD regions becomes a channel region 15.

An insulating interlayer 25 of silicon oxide or silicon nitride is formed over the entire surface of the above structure. First contact holes 27 exposing the source and drain regions 21 and 22 are formed in the insulating interlayer 25. Source and drain electrodes 29 and 30, connected electrically to the source and drain regions 21 and 22, are then formed in the first contact holes 27.

A passivation layer 31 consisting of silicon oxide is formed on the insulating interlayer 25 to cover the source and drain electrodes 29 and 30. A second contact hole 33 exposing the drain electrode 30 is then formed in the passivation layer 31. A pixel electrode 35 is connected electrically to the exposed drain electrode 22 through the second contact hole 33 formed in the passivation layer 31. In this case, the pixel electrode 35 is made of a substance which is transparent and electrically conductive such as indium-tin oxide (hereinafter abbreviated ITO), tin oxide (hereinafter abbreviated TO), or the like.

FIGS. 2A to 2E show cross-sectional views of the fabrication of the TFT according to a related art. Referring to FIG. 2A, a buffer oxidation layer is formed on a transparent insulated substrate 11, such as glass or and the like, by depositing silicon oxide by chemical vapor deposition (hereinafter abbreviated CVD). An active layer 15 is formed by deposition of amorphous silicon on the buffer oxidation layer 13, followed by dehydration and crystallization. The buffer oxidation layer 13 of this embodiment is then annealed by a laser, thereby preventing the active layer 15 from being penetrated by the impurities in the insulated substrate 11. Next, the active layer 15 is patterned by photolithography so that the photoresist remains on a predetermined portion of the buffer oxidation layer 13.

In the above step, the active layer 15 may be formed by depositing polycrystalline silicon at low temperature instead of by deposition, dehydration and crystallization of amorphous silicon.

Referring to FIG. 2B, an insulating substance such as silicon oxide, silicon nitride, or the like, is deposited on the buffer oxidation layer 13 by CVD to cover the active layer 15. Next, metal such as aluminum (Al) or molybdenum (Mo), or the like, is deposited on the insulating substance.

A photoresist pattern 20 remaining on a portion corresponding to the middle part of the active layer 15 is defined by coating the metal with photoresist and by exposing and developing the photoresist. Next, a gate electrode 19 and a gate insulating layer 17 are formed by patterning the metal and the insulating substance using the photoresist pattern as a mask.

In preferred embodiments, the gate electrode 19 and the gate insulating layer 17 are formed by anisotropically etching the metal and the insulating substance to expose the active layer 15 and by selectively overetching the metal to expose both side surfaces of the gate insulating layer 17. Thus the length of the gate electrode 19 is shorter than that of the gate insulating layer 17.

Referring to FIG. 2C, the photoresist pattern 20 is removed, and source and drain regions 21 and 22 and a lightly doped region 23 are formed by doping the active layer 15 with n-type impurities such as phosphorus (P), arsenic (As), or the like, using of the gate electrode 19 as a mask, with high dose and low energy ion implantation and with low dose and high energy ion implantation, respectively. In this case, the source and drain regions 21 and 22 are formed on exposed portions of the active layer 15 that extend beyond the gate insulating layer 17, while the lightly doped region 23 is formed where the gate insulating layer 17 overlaps the active layer 15.

Referring to FIG. 2D, an insulating interlayer 25 is formed by depositing insulating substance, such as silicon oxide, silicon nitride, or the like, on the entire surface of the above structure. Next, first contact holes 27 exposing the source and drain regions 21 and 22 are formed by removing predetermined portions of the insulating interlayer 25 by conventional photolithography and etching.

Metal, such as Al, or the like, is deposited on the insulating interlayer 25 to contact the source and drain regions 21 and 22 by filling up the first contact holes 27. Source and drain electrodes 29 and 30, connected electrically to the source and drain regions 21 and 22, are formed by patterning the metal to remain inside the first contact holes 27 by photolithography and etching.

Referring to FIG. 2E, a passivation layer 31 is formed on the insulating interlayer 25 by CVD of an insulating substance such as silicon oxide, silicon nitride, or the like, to cover the source and drain electrodes 29 and 30. Then, a second contact hole 33, exposing the drain electrode 30, is formed by removing a predetermined portion of the passivation layer 31 by photolithography and etching.

Next, a pixel electrode 35, connected electrically to the exposed drain electrode 22 through the second contact hole 33, is formed on the passivation layer 31 by depositing and patterning a substance which is transparent and electrically conductive. For example, a substance such as ITO or the like, may be used.

The TFT according to the related art has a top-gate structure because (1) the gate electrode is formed to expose both sides of the gate insulating layer, (2) the source and drain regions are formed in the exposed portions of the active layer with no gate insulating layer and (3) the lightly doped regions are formed in another portion overlapped with the gate insulating layer by implanting impurities into the active layer using the gate electrode as a mask. Accordingly, the TFT requires 6 masks for patterning the active layer, the gate insulating layer, the first contact holes, the source and drain electrodes, the second contact hole and the pixel electrode.

A problem in manufacturing a TFT according to the related art is that it requires a complicated process, because the source/drain electrodes and the gate electrode are formed using different masks. The process, therefore, becomes complicated due to the increased number of masks and the planarization degree decreases.

SUMMARY OF THE INVENTION

Accordingly, the present invention is directed to a thin film transistor and a fabricating method thereof that substantially obviates one or more of the problems due to limitations and disadvantages of the related art.

The object of the present invention is to provide a TFT which improves the degree of planarization, because source/drain electrodes and a gate electrode are formed by patterning the same layer.

Another object of the present invention is to provide a method of fabricating a TFT which reduces the steps of fabrication by patterning a gate electrode and source/drain electrodes with a single mask.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes an insulated substrate which is transparent; a source electrode and a drain electrode formed on the insulated substrate, the source and drain electrodes separated each other; a gate electrode formed between the source and drain electrodes on the insulated substrate; a gate insulating layer covering the source and drain electrodes and the gate electrode on the gate insulating layer; an active layer on the gate insulating layer wherein source and drain regions are formed at both ends of the active layer corresponding to the gate electrode and wherein a channel region is formed between the source and drain regions; a passivation layer on the gate insulating layer, the passivation layer covering the active layer; first and second contact holes exposing the source and drain regions and the source and drain electrodes, respectively; a first wire on a predetermined part of the passivation layer, the first wire electrically connecting the source region to the source electrode through the first contact hole; and a second wire on another predetermined part of the passivation layer, the second wire electrically connecting the drain region to the drain electrode through the second contact hole.

In another embodiment, the present invention includes the steps of depositing a metal on an insulated substrate which is transparent; forming source and drain electrodes and a gate electrode by patterning the metal wherein the source and drain electrodes and the gate electrode are separated one another electrically; forming a gate insulating layer on the insulated substrate, wherein the gate insulating layer covers the gate electrode and the source and drain electrodes; forming an active layer between the source and drain electrodes on the gate insulating layer; coating the gate insulating layer and the active layer with photoresist; defining a photoresist pattern by exposing the active layer by back exposure through the substrate and subsequent development of the photoresist; forming source and drain regions by doping the exposed portion of the active layer with impurities using the photoresist pattern as a mask; removing the photoresist pattern; forming a passivation layer on the gate insulating layer; forming first contact holes exposing the source and drain regions and second contact holes exposing the source and drain electrodes by patterning the passivation layer and the gate insulating layer; and forming first and second wires connecting the source and drain regions electrically to the source and drain electrodes through the first and second contact holes, respectively.

In another embodiment, the present invention includes the steps of depositing a metal on an insulated substrate which is transparent; forming source and drain electrodes and a gate electrode by patterning the metal using a single mask, wherein the source and drain electrodes and the gate electrode are separated from one another electrically; forming a gate insulating layer on the insulated substrate, wherein the gate insulating layer covers the gate electrode and the source and drain electrodes; forming an amorphous silicon layer on the gate insulating layer; coating the amorphous silicon layer with photoresist; defining a photoresist pattern that remains on regions corresponding to the gate electrode and the source and drain electrodes by back exposure through the substrate and development of the photoresist; doping exposed portions of the amorphous silicon layer with a heavy dose of impurity ions; removing the photoresist pattern; forming an active layer by crystallizing the amorphous silicon layer and forming source and drain regions by activating the impurity ions; forming a passivation layer on the gate insulating layer that covers the active layer; forming first contact hole that expose the source and drain regions and second contact holes that expose the source and drain electrodes by patterning the passivation layer and the gate insulating layer; and forming first and second wires connecting the source and drain regions electrically to the source and drain electrodes through the first and second contact holes, respectively.

In yet another embodiment, the present invention includes the steps of depositing metal on an insulated substrate which is transparent; forming source and drain electrodes and a gate electrode by patterning the metal with a single mask, wherein the source and drain electrodes and the gate electrode are separated from one another electrically; forming a gate insulating layer on the insulated substrate, wherein the gate insulating layer covers the gate electrode and the source and drain electrodes; forming an active layer between the source and drain electrodes on the gate insulating layer; coating the gate insulating layer and the active layer with photoresist; defining a photoresist pattern so that photoresist remains on regions corresponding to the source and drain electrodes and the gate electrode by exposure and development of the photoresist; forming first contact holes that expose both ends of the active layer and second contact holes exposing the source and drain electrodes using the photoresist pattern as a mask; exposing a portion of the passivation layer which extends beyond the gate electrode by back exposure through the substrate and development using the gate electrode and the source and drain electrodes as masks; forming source and drain regions and a lightly doped region in the active layer using the passivation layer and the photoresist pattern as masks, respectively; removing the photoresist pattern; forming a passivation layer on the gate insulating layer; forming first contact holes that expose the source and drain regions and second contact holes that expose the source and drain electrodes; and forming first and second wires connecting the source and drain regions electrically to the source and drain electrodes through the first and second contact holes, respectively.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings:

FIGS. 4A to 4E show cross-sectional views of stages of fabrication of a TFT according to a first embodiment of the present invention;

FIGS. 5A to 5B show cross-sectional views of stages of fabrication of a TFT according to a second embodiment of the present invention.

DETAILED DESCRIPTION OF PREFERRED EMBODIMENTS

Reference will now be made in detail to the preferred embodiments of the present invention, examples of which are illustrated in the accompanying drawings.

Figure 1:
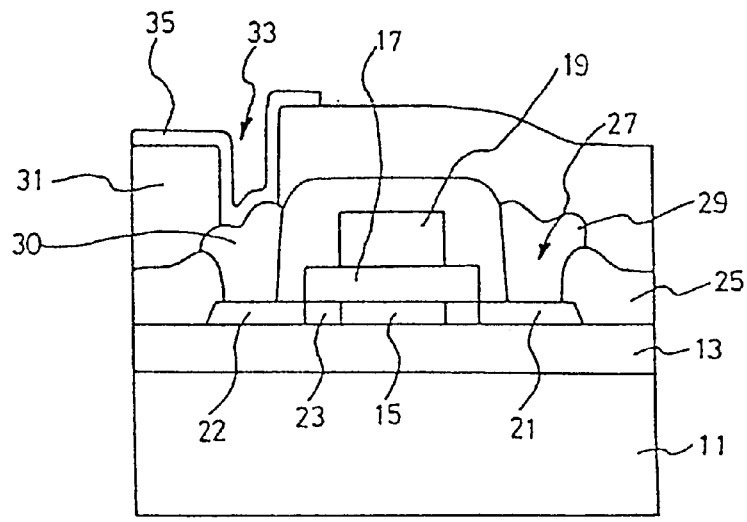
FIG. 1 shows a cross-sectional view of a TFT according to a related art.
Figure 2A:
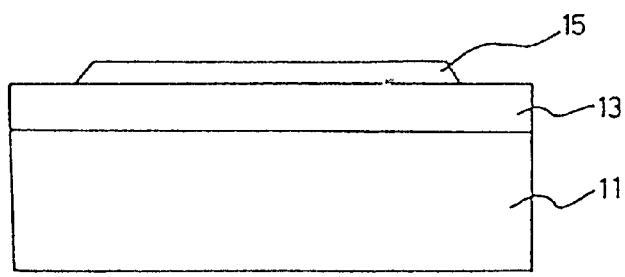
FIGS. 2A to 2E show cross-sectional views of fabricating a TFT according to a related art.
Figure 2B:
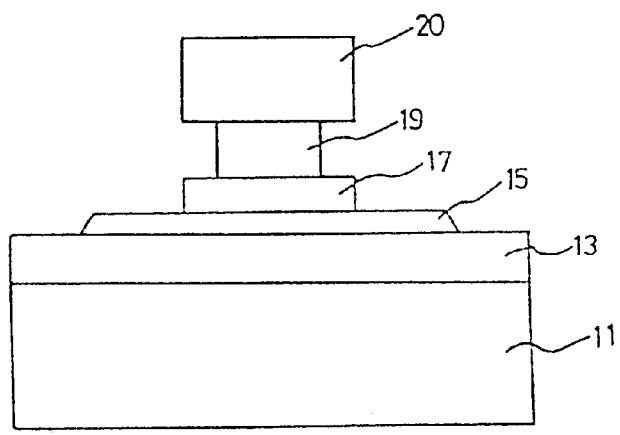
Figure 2C:
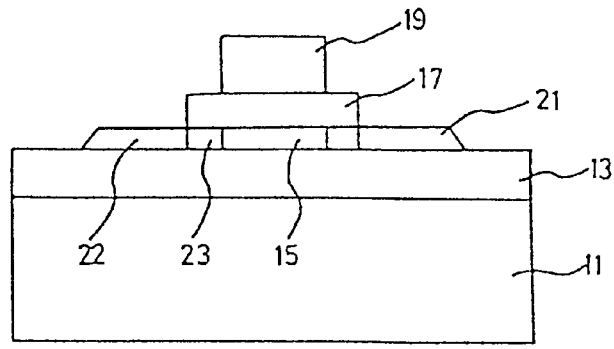
Figure 2D:
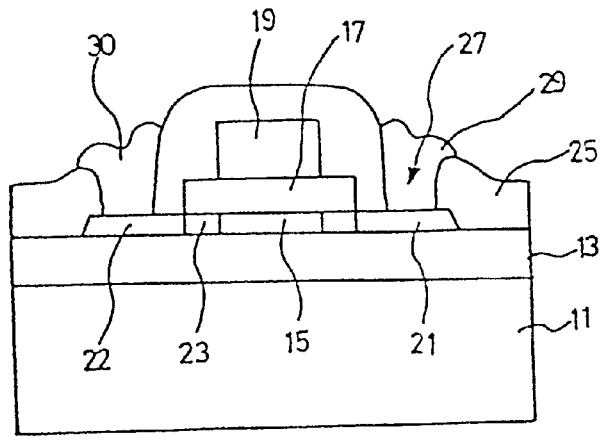
Figure 2E:
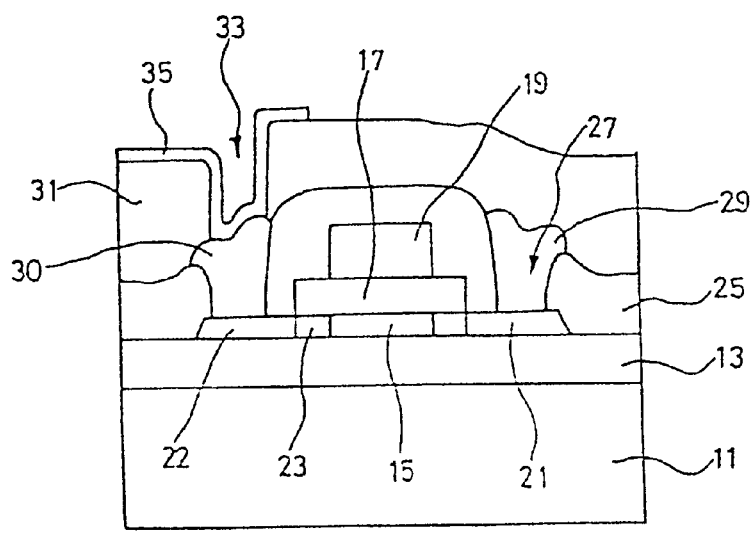
Figure 3:
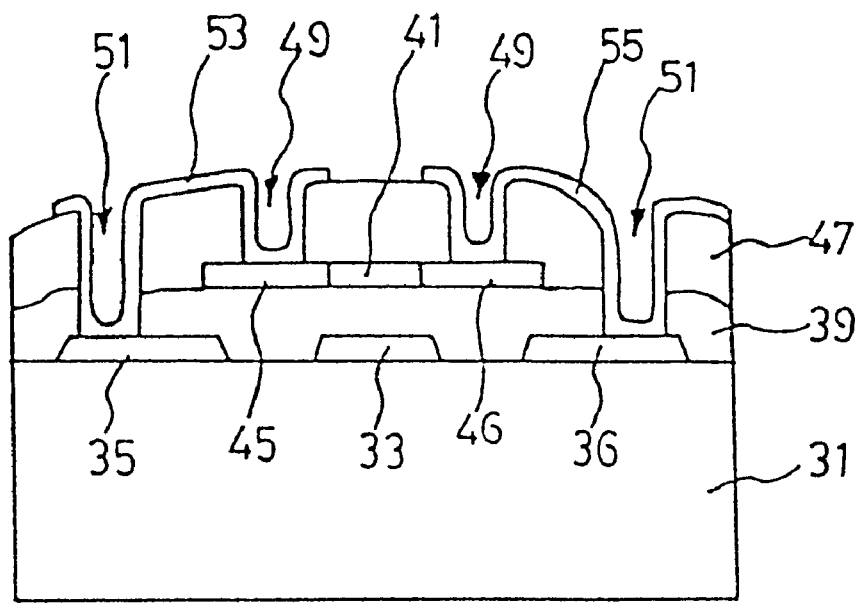
FIG. 3 shows a cross-sectional view of a TFT according to the present invention.

FIG. 3 shows a cross-sectional view of a TFT according to the present invention. Referring to FIG. 3, in a TFT of the present invention, a gate electrode 33, source and drain electrodes 35 and 36 are formed preferably on a transparent insulated substrate 31 of glass, or the like. The electrodes have a thickness in the range of about 1000–5000 angstroms. The electrodes are electrically separated from one another electrically along a first axis that runs parallel to the surface of the substrate and approximately through the middle of the electrodes. The gate electrode 33, the source and drain electrodes 35 and 36 are formed by using a single mask to pattern a single layer of metal, such as Al, Mo, or the like. Not shown in the drawing, gate lines connected to the gate electrode 33 and the source electrode 35 have common bus shapes.

A gate insulating layer 39 is formed on the insulated substrate 31 to cover the gate electrode 33. An active layer 41 is formed on the gate insulating layer 39 in a region overlying the gate electrode 33. The gate insulating layer 39 is an insulating substance, such as silicon oxide, silicon nitride, or the like, and has a thickness in the range of about 500–3000 angstroms. The active layer 41 of polycrystalline silicon has a thickness of about 30–1000 angstroms.

A source region 45 and a drain region 46 doped heavily with n- or p-type impurities are formed at each end of the active layer 41 that preferably extends beyond the region where the active layer overlays the gate electrode 33. The rest of the active layer 41, corresponding to the region that overlays the gate electrode 33, is not doped with impurities, and thus becomes a channel region.

A passivation layer 47 having a thickness of about 3000–10000 angstroms is formed by depositing an insulating substance, such as silicon oxide, silicon nitride, or the like, on the entire surface of the above-mentioned structure. First contact holes 49 that expose the source and drain regions 45 and 46 are formed by removing the gate insulating layer 39, and then second contact holes 51 that expose the source and the drain electrodes 35 and 36 are formed by removing both the gate insulating layer 39 and the passivation layer 47.

A first wire 53 electrically connecting the source region 45 to the source electrode 35 and a second wire 55 electrically connecting the drain region 46 to the drain electrode 36 are formed on predetermined portions of the passivation layer 47 through the first and second contact holes 49 and 51, respectively. The first and second wires 53 and 55 are made of electrically-conductive and transparent substance, such as ITO, TO, or the like, and the second wire 55 is also used as a pixel electrode.

In the above description of a TFT according to the present invention, the source and drain electrodes 35 and 36 covered with the gate insulating layer 39 are formed on the insulated substrate 31 and are connected electrically to the source and drain regions 45 and 46 by the first and second wires 53 and 55, respectively, through the first and second contact holes 49 and 51.

A structure where the source and drain electrodes 35 and 36 on the insulated substrate 31 is covered with the gate insulating layer 39 and a planarized active layer 41, having the source and drain regions 45 and 46, is called a "buried bus coplanar" (hereinafter abbreviated BBC) TFT. The TFT of the BBC structure improves planarization of the layers since the gate electrode 33 is formed from the same layer that is patterned to form the electrodes 33, 35 and 36.

In a TFT according to a second embodiment of the present invention, lightly doped regions (LDD regions) are formed between the channel region and source/drain regions of the active layer. The process of forming a TFT with LDD regions is discussed in reference to FIGS. 6A to 6C.

Figure 4A:
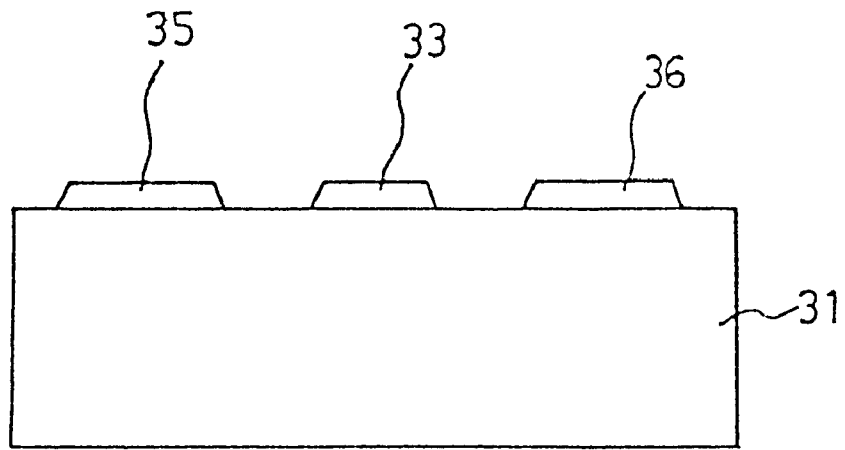

FIGS. 4A to 4D show cross-sectional views of TFT fabricating steps according to a first embodiment of the present invention. Referring to FIG. 4A, in a TFT of the present invention, metal, such as Al, Mo, or the like, is deposited on a transparent insulated substrate 31 of glass, or the like, at a thickness of about 1000–5000 angstroms by sputtering or CVD. Next, a gate electrode 33 and source/drain electrodes 35 and 36 are formed by patterning the deposited metal with a single photolithography mask. The gate electrode 33 lies between the source and drain electrodes 35 and 36 and the three electrodes are separated electrically from one another. Not shown in the drawing, gate lines connected to the gate electrode 33 and the source electrode 35 have bus shapes.

Figure 4B:
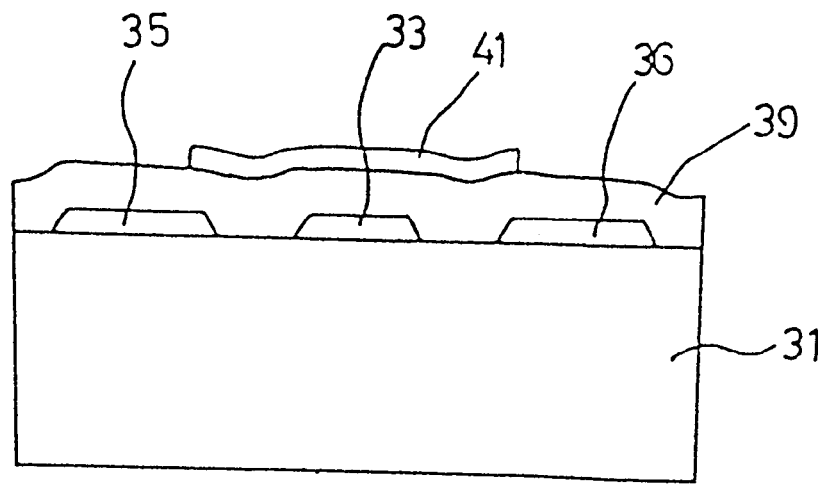

Referring to FIG. 4B, a gate insulating layer 39 is formed on the insulated substrate 31 to cover the gate electrode 33 by depositing an insulating substance, such as silicon oxide, silicon nitride, or the like, at a thickness in the range of about 500–3000 angstroms. An active layer 41 is preferably formed by dehydration and laser annealing of the amorphous silicon that was deposited on the gate insulating layer 39 in a thickness range of about 300–1000 angstroms. Alternatively, other crystallization methods known to one of ordinary skill in the art may also be, used. Accordingly, when laser annealing is carried out, the gate insulating layer 39 prevents impurities in the insulated substrate 31 from diffusing into the active layer 41.

Next, the active layer 41 is photolithographically patterned to remain between the source and drain electrodes 35 and 36 in the gate insulating layer 39. In the above step, the active layer 41 may be formed by depositing polycrystalline silicon at low temperature instead of by deposition, dehydration and laser annealed crystallization of amorphous silicon.

Figure 4C:
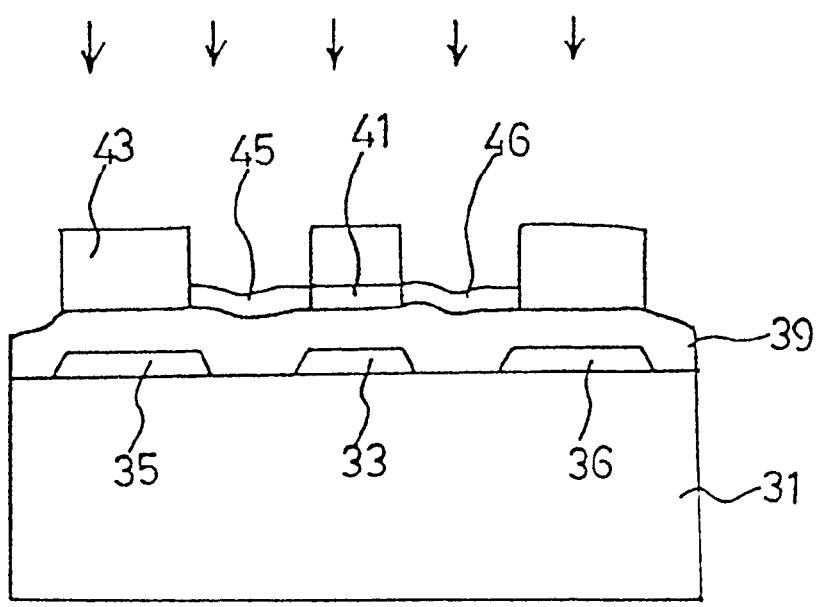

Referring to FIG. 4C, the gate insulating layer 39 is coated with photoresist to cover the active layer 41. Next, a photoresist pattern 43 is defined by back exposure and development using the gate, source and drain electrodes 33, 35, and 36 as masks. "Back exposure", as used herein, means that the photolithography light source is beneath the transparent substrate 31 and shines through it using the electrodes as a mask. Using this procedure, the photoresist pattern 43 remains just on the regions that overlay the electrodes 33, 35 and 36, but regions of the active layer 45, 46 between the gate electrode 33 and the source/drain electrodes 35 and 36 are free of photoresist.

Source and drain regions 45, 46 are formed by doping the exposed parts of the active layer 41 with n-type impurities, such as P, As, or the like, or p-type impurities such as B, or the like, by heavy dose ion implantation using the photoresist pattern 43 as a mask. In this case, the remaining portion of the active layer 41, which corresponds to the gate electrode 33 and which is not doped with impurities, becomes a channel region.

Referring to FIG. 4D, the photoresist pattern is removed. A passivation layer 47 having a thickness of about 3000–10000 angstroms is formed on the gate insulating layer 39 by CVD deposition of an insulating substance, such as silicon oxide, silicon nitride, or the like, to cover the active layer 41.

First contact holes 49 that expose the source and drain regions 45 and 46 and second contact holes 51 that expose the source and drain electrodes 35 and 36 are formed by photolithography and anisotropic etching. In this photolithographic step, the first and second contact holes 49 and 51 are formed by a single etch step, wherein the first contact holes 49 are formed by removing the passivation layer 47 and the second contact holes 51 are formed by removing the passivation layer 47 and the gate insulating layer 39. During the etching to form the second contact holes 51, after the passivation layer 47 has been removed, only the gate insulating layer 39 is etched, because the gate insulating layer 39 has a faster etching rate than the polysilicon in the source and drain regions 45 and 46.

Electrically-conductive and transparent substance, such as ITO, TO, or the like, are deposited on the passivation layer 47 to connect the source and drain regions 45 and 46 to the source and drain electrodes 35 and 36 through the first and second contact holes 49 and 51.

A first wire 53 electrically connecting the source region 45 to the source electrode 35 and a second wire 55 electrically connecting the drain region 46 to the drain electrode 36 are formed on predetermined portions of the passivation layer 47 through the first and second contact holes 49 and 51, respectively, by patterning the electrically-conductive and transparent substance by photolithography. In this case, the first and second wires are separated from one another electrically and the second wire 55 connecting the drain region 46 to the drain electrode 36 is also used as a pixel electrode.

FIGS. 5A to 5B show cross-sectional views of certain stages of fabrication of a TFT according to a second embodiment of the present invention. Referring to FIG. 5A, after the step shown in FIG. 4A has been carried out, a gate insulating layer 39 having a thickness of about 500–3000 angstroms is formed by CVD of an insulating substance, such as silicon oxide, silicon nitride, or the like, on the insulated substrate 31 to cover the source and drain electrodes 35 and 36. Then, an amorphous silicon layer 37 having a thickness of about 300–1000 angstroms is formed on the gate insulating layer 39 by CVD.

The amorphous silicon layer 37 is coated with photoresist. Next, a photoresist pattern 43 is defined by back exposure and development using the gate, source and drain electrodes 33, 35, and 36 as masks. In this case, the photoresist pattern 43 remains only on the regions overlying the electrodes 33, 35 and 36 but the amorphous silicon layer 37 between the gate electrode 33 and the source/drain electrodes 35 and 36 is free of photoresist.

Impurity-ion implanted regions 38 are formed by doping the photoresist-free regions of the amorphous silicon layer 37 with n-type impurities, such as P, As, or the like, or p-type impurities, such as B, or the like, by heavy dose ion implantation using the photoresist pattern 43 as a mask.

Referring to FIG. 5B, the photoresist pattern is removed. An active layer 41 is formed by dehydration and laser annealing of the amorphous silicon layer 37 and source and drain regions 45 and 46 are formed by activating the impurity ions in the ion implanted regions 38. During this process, when laser annealing is carried out, the gate insulating layer 39 prevents impurities in the insulated substrate 31 from diffusing into the active layer 41 where the source and drain electrodes 35 and 36 lie.

Next, the active layer 41 is patterned to remain only between the source and drain electrodes 35 and 36 in the gate insulating layer 39 by photolithography.

In this case, the remaining active layer 41 between the source and drain electrodes 35 and 36, which overlays the gate electrode 33, and which is not doped with impurities, becomes a channel region.

Successively, the steps shown in FIGS. 4D are carried out.

In the second embodiment of the present invention, the entire process becomes simplified because the crystallization of the active layer by laser annealing and the activation of the ion-implanted impurities are carried out simultaneously.

Figure 6A:
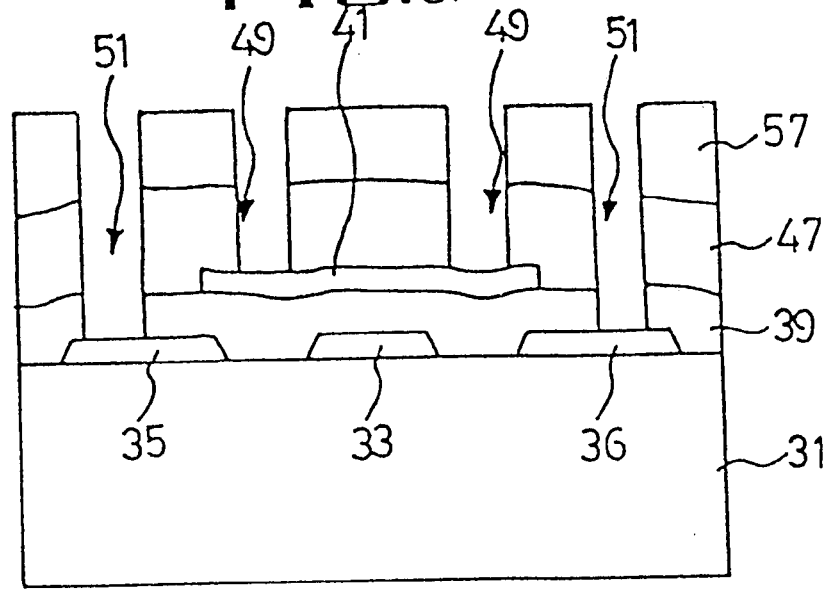
FIGS. 6A to 6C show cross-sectional views of stages of fabrication of a TFT according to a third embodiment of the present invention.
Figure 6B:
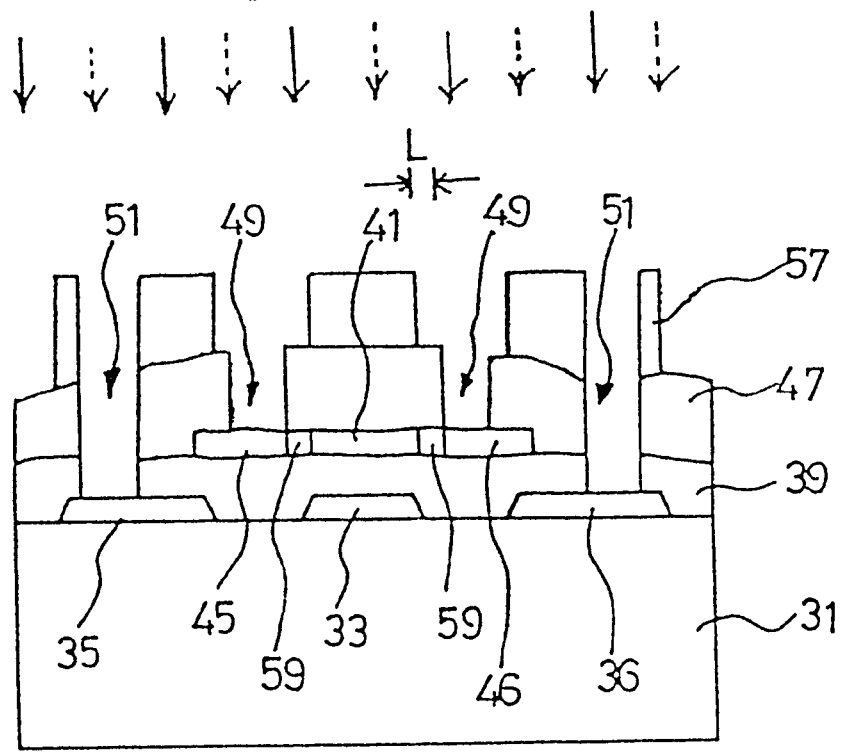
Figure 6C:
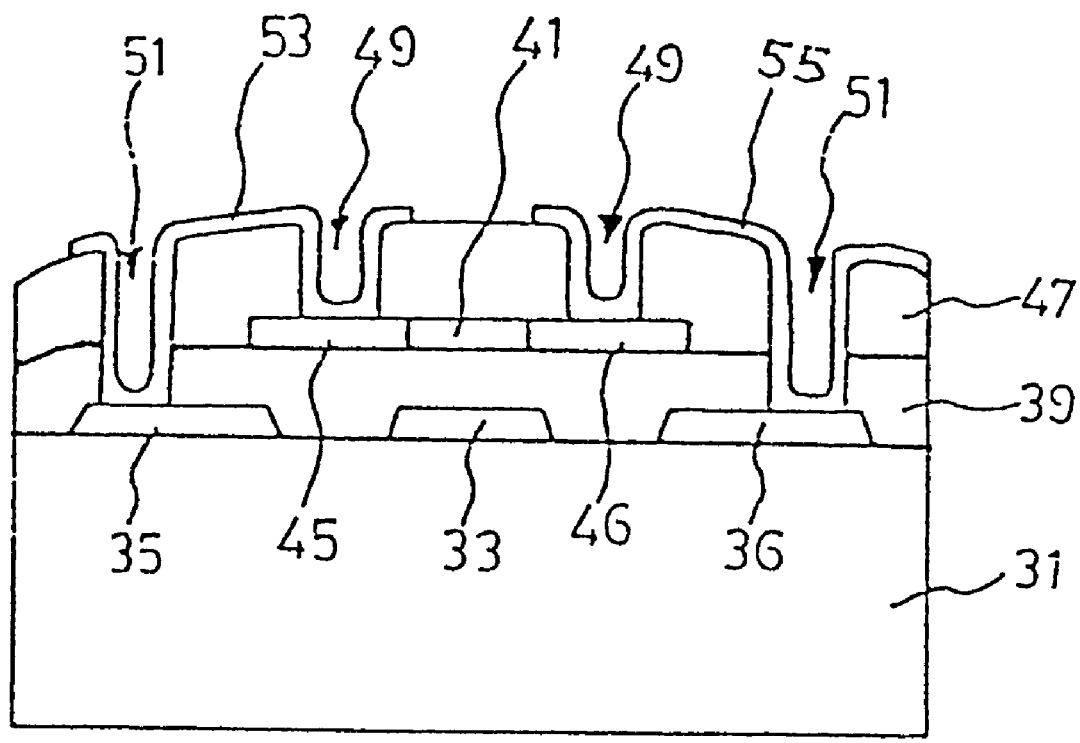

FIGS. 6A to 6C show cross-sectional views of stages in the fabrication of a TFT according to a third embodiment of the present invention. Referring to FIG. 6A, after the steps shown in FIG. 4B have been carried out, a passivation layer 47 having a thickness of about 3000–10000 angstroms is formed on the gate insulating layer 39 by depositing an insulating substance, such as silicon oxide, silicon nitride, or the like, to cover the active layer 41 by CVD. Then, a photoresist pattern 57 is formed by exposure and development after the passivation layer 47 has been coated with photoresist. In this case, the photoresist pattern 57 is defined to expose predetermined portions of the passivation layer 47 corresponding to the source and drain electrodes 35 and 36 and both ends of the active layer 41.

First, contact holes 49 exposing both ends of the active layer 41 and second contact holes 51 exposing the source and drain electrodes 35 and 36 are formed by photolithography and anisotropic etching using the photoresist pattern 57 as a mask. In this photolithographic step, the first and second contact holes 49 and 51 are formed by a single photolithographic etch, wherein the first contact holes 49 are formed by removing the passivation layer 47 and the second contact holes 51 are formed by removing the passivation layer 47 and the gate insulating layer 39.

During the subsequent etch to form the second contact holes 51, after the passivation layer 47 has been removed, only the gate insulating layer 39 is etched because the etch rate of the gate insulating layer 39 is faster than the etch rate of the polycrystalline silicon in the active layer 41.

Referring to FIG. 6B, back exposure and development are carried out using the electrodes 33, 35 and 36 as masks while the photoresist pattern 57 still remains. In this case, a portion of the photoresist pattern 57 that does not overlay the gate electrode 33 is removed to expose a portion of the passivation layer 47 in the region L.

Source and drain regions 45 and 46 and a lightly doped region 59 are formed by doping both ends of the active layer 45 with n-type impurities, such as P, As, or the like, or p-type impurities such, as B, or the like, and by activating the impurities.

In the above step, the source and drain regions are formed by implanting heavy dose, low energy impurity ions using the passivation layer 47 as a mask and by activating the ions, while the lightly doped region 59 is formed by implanting light dose, high energy impurities where the energy is sufficient to penetrate the passivation layer 39 using the photoresist pattern 57 as a mask and by activating the impurities.

Referring to FIG. 6C, after the photoresist pattern 57 has been removed, electrically-conductive and transparent substance such as ITO, TO, or the like, are deposited on the passivation layer 47 to connect the source and drain regions 45 and 46 to the source and drain electrodes 35 and 36 through the first and second contact holes 49 and 51.

A first wire 53 electrically connecting the source region 45 to the source electrode 35 and a second wire 55 electrically connecting the drain region 46 to the drain electrode 36 are formed, respectively, by patterning the electrically-conductive and transparent substance by photolithography. In this case, the first and second wires are separated from one another electrically and the second wire 55 connecting the drain region 46 to the drain electrode 36 is also used as a pixel electrode.

As mentioned in the foregoing description, a TFT according to the present invention has a BBC structure, wherein source/drain electrodes and a gate electrode are formed at the same time by patterning a metal layer and a planarized active layer is formed by placing a gate insulating layer between the gate electrode and the active layer. Source and drain regions formed at both ends of the active layer are connected to source and drain electrodes by first and second wires through first and second contact holes, respectively.

Accordingly, the present invention improves the degree of planarization, because source/drain electrodes and a gate electrode are formed by patterning the same layer. Further, the present invention reduces the number of fabrication steps by patterning a gate electrode and source/drain electrodes with a single mask.

It will be apparent to those skilled in the art that various modifications and variations can be made in a thin film transistor and a fabricating method thereof of the present invention without departing from the spirit or scope of the inventions. Thus, it is intended that the present invention covers the modifications and variations of this invention provided they come within the scope of the appended claims and equivalents.

What is claimed is:

1. A thin film transistor comprising:
    a substrate;
    a source electrode and a drain electrode formed on the substrate, the substrate having a first axis, the source and drain electrodes separated from each other along the first axis;
    a gate electrode formed between the source and drain electrodes on the substrate along the first axis;
    a gate insulating layer at least partially covering the source and drain electrodes and the gate electrode;
    an active layer formed on the gate insulating layer, the active layer having a second axis parallel to the first axis and a source region and a drain region formed in the active layer and separated from one another along the second axis and a channel region formed therebetween; and
    a passivation layer formed on the gate insulating layer, the passivation layer covering the active layer.

2. The thin film transistor according to claim 1, further comprising:
    first and second source contact holes formed in the passivation layer to expose the source region and electrode and first and second drain contact holes exposing the drain region and electrode;
    a first wire formed on a first preselected region of the passivation layer, the first wire electrically connecting the source region through the first source contact hole to the source electrode through the second source contact hole; and
    a second wire on a second preselected region of the passivation layer, the second wire electrically connecting the drain region through the first drain contact hole to the drain electrode through the second drain contact hole.

3. The thin film transistor according to claim 1, wherein the gate electrode and the source and drain electrodes are formed patterning a metal layer with a single mask.

4. The thin film transistor according to claim 1, wherein the gate electrode and the source and drain electrodes are formed concurrently using a single mask.

5. The thin film transistor according to claim 1, wherein the first and second wires are made of a transparent, electrically-conductive material.

6. The thin film transistor according to claim 5, wherein the transparent, electrically-conductive material is at least one of indium tin oxide and tin oxide.

7. The thin film transistor according to claim 2, wherein the second wire is a pixel electrode.

8. The thin film transistor according to claim 1, wherein the active layer further comprises lightly-doped regions along the second axis between the channel region and the drain region and between the channel region and the source region.

9. The thin film transistor according to claim 8, further comprising:
- first and second source contact holes formed in the passivation layer to expose the source region and electrode and first and second drain contact holes exposing the drain region and electrode;
- a first wire formed on a first preselected region of the passivation layer, the first wire electrically connecting the source region through the first source contact hole to the source electrode through the second source contact hole; and
- a second wire on a second preselected region of the passivation layer, the second wire electrically connecting the drain region through the first drain contact hole to the drain electrode through the second drain contact hole.

10. The thin film transistor according to claim 8, wherein the gate electrode and the source and drain electrodes are formed patterning a metal layer with a single mask.

11. The thin film transistor according to claim 8, wherein the gate electrode and the source and drain electrodes are formed concurrently using a single mask.

12. The thin film transistor according to claim 8, wherein the first and second wires are made of a transparent, electrically-conductive material.

13. The thin film transistor according to claim 12, wherein the transparent, electrically-conductive material is at least one of indium tin oxide and tin oxide.

14. The thin film transistor according to claim 9, wherein the second wire is a pixel electrode.

* * * * *